US005410448A

United States Patent [19]
Barker, III et al.

[11] Patent Number: 5,410,448
[45] Date of Patent: Apr. 25, 1995

[54] ADAPTIVE COOLING SYSTEM

[75] Inventors: Charles R. Barker, III, Harvard, Mass.; Richard E. Olson, Rindge, N.H.

[73] Assignee: Digital Equipment Corporation, Maynard, Mass.

[21] Appl. No.: 104,518

[22] Filed: Aug. 10, 1993

Related U.S. Application Data

[63] Continuation of Ser. No. 823,637, Mar. 2, 1992, abandoned.

[51] Int. Cl.6 ............................................. H05H 7/20
[52] U.S. Cl. .................................. 361/695; 361/691; 374/143
[58] Field of Search ..................... 62/407–408, 62/413–417; 361/694–697; 374/142, 143; 307/118

[56] References Cited

U.S. PATENT DOCUMENTS

| | | | |
|---|---|---|---|
| 3,592,260 | 7/1971 | Berger | 361/384 |
| 4,296,455 | 10/1981 | Leaycraft et al. | |
| 4,361,967 | 12/1982 | Bahnsen et al. | |
| 4,502,099 | 2/1985 | Manes et al. | |
| 4,502,100 | 2/1985 | Greenspan et al. | |
| 4,644,443 | 2/1987 | Swensen et al. | |
| 4,669,025 | 5/1987 | Barker, III et al. | |
| 4,672,509 | 6/1987 | Speraw | 361/391 |
| 4,674,704 | 6/1987 | Altoz et al. | |
| 4,750,552 | 6/1988 | Lanquist et al. | |
| 4,756,473 | 7/1988 | Takemae et al. | |
| 4,817,865 | 4/1989 | Wray | 361/384 |
| 4,821,145 | 4/1989 | Corfits et al. | 361/383 |
| 4,837,663 | 6/1989 | Zushi et al. | |
| 4,894,749 | 1/1990 | Elko et al. | 361/383 |
| 4,931,904 | 6/1990 | Yin | 361/384 |
| 5,027,254 | 6/1991 | Corfits et al. | 361/415 |
| 5,102,040 | 4/1992 | Harvey | 361/384 |
| 5,121,291 | 6/1992 | Cope et al. | 361/384 |

Primary Examiner—Gregory D. Thompson
Attorney, Agent, or Firm—Denis G. Maloney; Albert P. Cefalo

[57] ABSTRACT

A parallel air flow system which automatically maintains proper coolant flow regardless of the number of circuit boards installed in an enclosure. The enclosure is constructed such that air flow path through any one slot does not affect the air flow through any other slot. Proper air flow through the entire system is maintained by an air flow sensor disposed in an air flow path having a known air flow resistance. This sensor controls the speed of an air-mover in order to maintain a constant predetermined air flow through the known resistance, in such a way that a constant static air pressure is maintained at each slot. Baffle modules are preferably inserted into the enclosure to prevent air flow into any empty slots, to reduce the total air volume necessary to achieve the predetermined static pressure, thereby reducing the audible noise generated by the air-mover.

17 Claims, 8 Drawing Sheets

ADAPTIVE COOLING SYSTEM

This application is a continuation of application Ser. No. 07/823,637 filed on Mar. 2, 1992, now abn.

FIELD OF THE INVENTION

This invention relates generally to cooling electronic circuitry, and particularly to a system which automatically adjusts coolant flow over the circuitry, regardless of the number of circuit boards installed in an enclosure.

BACKGROUND OF THE INVENTION

Electronic systems are typically packaged by mounting individual components such as integrated circuits (ICs) on printed circuit boards. A number of circuit boards are then housed in an enclosure, typically by placing them in slots spaced parallel to one another. Electrical interconnections between the circuit boards are provided by a mother board, sometimes called a backplane, which is disposed perpendicular to corresponding ends of the slots; in certain configurations, integrated circuits may also be mounted on the mother board.

This packaging arrangement is used for computer systems ranging from the smallest personal computer to the largest mainframe. There are several reasons for its popularity, but chief among them seems to be that optional features may be added by simply inserting additional circuit boards into empty mother board slots.

Various schemes are used for cooling a system packaged in this way. Most high performance components cannot cool themselves adequately by connection alone, and thus require an auxiliary cooling apparatus of some sort. The typical cooling apparatus is an air-mover such as a blower or fan positioned to force ambient temperature air across the circuit boards. By orienting the air-mover and circuit boards so that the ambient air is presented to all of the circuit boards in parallel, maximum component reliability is achieved.

A commonly perceived problem with this parallel airflow scheme is that it requires relatively large volumes of air, which, in turn, means that it is fairly noisy. Certain schemes are presently used which reduce the required air volume, such as by reusing the exhaust air. For example, see U.S. Pat. No. 4,837,663 issued to Zushi, et al. in which draft ducts are used to divide and re-mix the air flow between two enclosures, and see U.S. Pat. No. 4,502,100 to Greenspan, et al. in which baffles redirect the air exiting from one side of the circuit boards to their opposite sides.

Unfortunately, by reusing exhaust air which is of a higher temperature than the ambient air, at least some of the components are operated at a higher temperature, and overall system reliability is reduced.

In addition, some have proposed schemes which dynamically control the speed of the air-mover, as in U.S. Pat. No. 4,669,025 to Barker et al. and assigned to Digital Equipment Corporation. The approach shown in that patent adjusts the air flow in response to environmental changes such as ambient temperature, air density, and altitude. It is not directly applicable to minimizing the overall air flow while maximizing component reliability, however.

What is needed is a parallel air flow system wherein the reliability of the system is maximized by presenting ambient temperature air to all circuit boards in parallel, and wherein the required air flow is reduced when the system configuration is reduced, thereby keeping the audible noise to a minimum.

SUMMARY OF THE INVENTION

The invention is a parallel circuit board enclosure in which the air flow path through any one parallel slot does not affect the air flow through any other slot. Proper air flow through the entire system is maintained by an air sensor disposed in one of the parallel paths having a fixed, known air flow resistance. The air sensor measures the static air pressure in the known resistance path, either directly or indirectly, and controls the speed of an air-mover to maintain a constant, predetermined, air flow through the known resistance. Constant static air pressure is thus automatically maintained across each of the air flow paths in the system; at the same time constant flow is also maintained as well.

Baffle modules are preferably inserted into the enclosure to prevent air flow through any empty slots. This, in turn, reduces the total air flow volume necessary to achieve the predetermined static pressure, the air-mover speed is reduced automatically. The baffle modules and the circuit board modules may include peripheral flanges which cooperate with seals disposed in the enclosure, to assist in maintaining slot-to-slot independence of the air flow.

The circuit board modules may each include a housing with contoured sides that further specifically direct the airflow over the components exactly as desired, which further restricts the required air flow volume necessary to maintain the desired static pressure.

The air sensor may be disposed in any of the parallel air flow paths, on a circuit board which is always installed in the system, or in an air flow channel which is common to all air flow paths, such as at the air-mover plenum. If the air flow sensor is positioned within the air-mover, it is preferably placed within a circumferential channel which is fed by a number of taps distributed about the plenum, to provide a better indication of the average air pressure at the plenum.

The air flow sensor may sense one of several different aspects of the air flow to determine the static air pressure. For example, the sensor may be a differential pressure sensor which directly senses the static air pressure. However, in lower cost applications, the sensor may detect some other physical quantity which varies as the static air pressure varies, such as air flow volume or temperature.

The baffle modules may be formed from an integral piece of thermoplastic material which is shaped to fit into the enclosure in the same way that a circuit board fits into the enclosure.

There are several advantages to this arrangement. Since the air flows only through the slots which have a circuit board installed within, the total required air volume scales up or down as the system configuration changes, without sacrificing component reliability.

In addition, if a baffle module is accidentally left out of a slot, the audible noise generated by the system increases, but no damage occurs to the components of the system, since the only effect is to increase the overall air flow.

One embodiment of the invention reduces the air flow required for an entry level system by about seventy percent, with an audible air-mover noise reduction of about fourteen decibels.

BRIEF DESCRIPTION OF THE DRAWINGS

The novel features and advantages believed to be characteristic of the invention are set forth in the appended claims. The best mode for carrying out the invention and its particular features and advantages can be better understood by referring to the following detailed description, read together with the accompanying drawings, in which:

DETAILED DESCRIPTION OF ILLUSTRATIVE EMBODIMENTS

Figure 1:
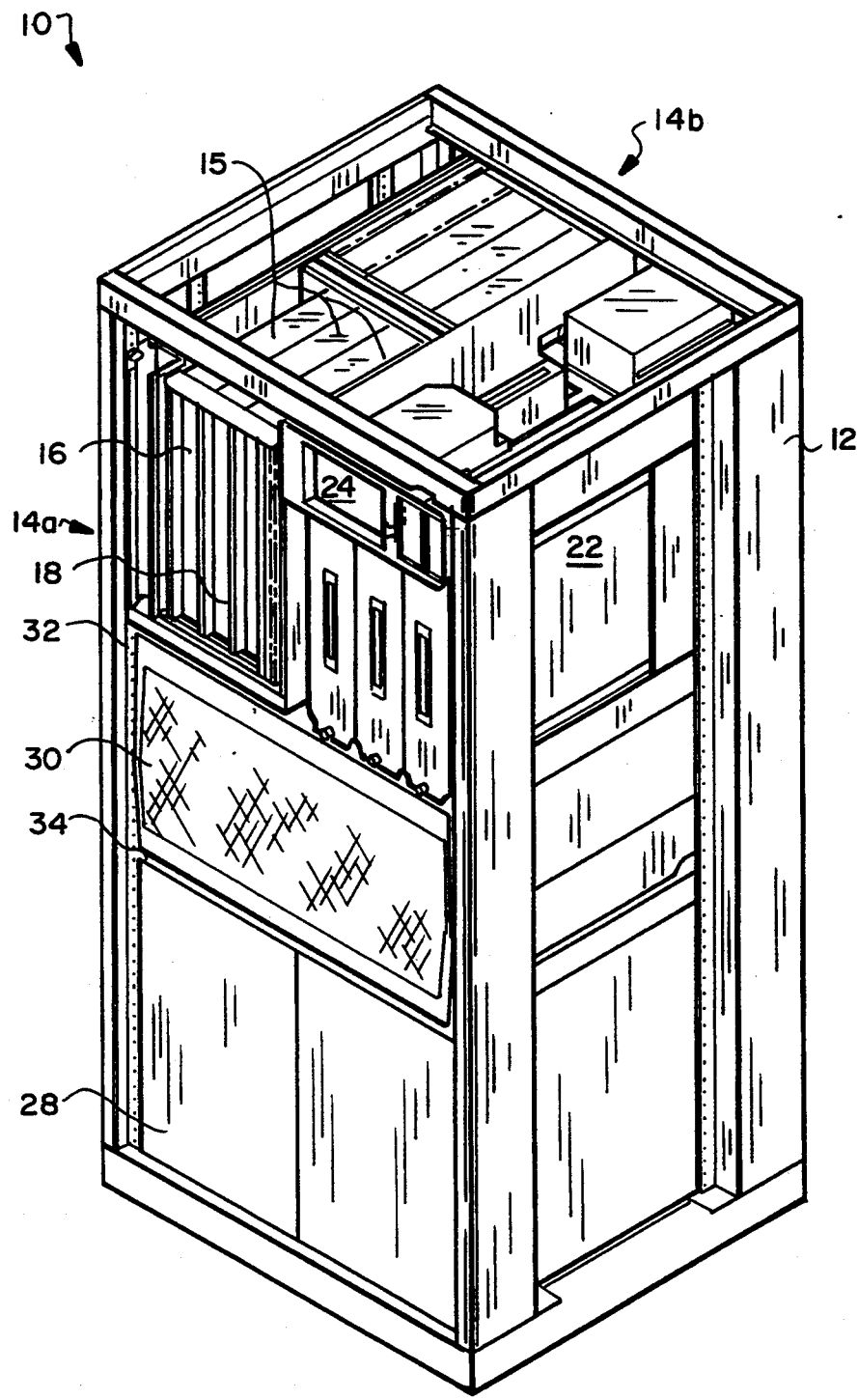
FIG. 1 is a perspective view of a system rack assembly which includes a cooling system according to the invention.

Turning attention to the drawings more particularly, FIG. 1 shows an electronic system such as a computer 10 packaged in a frame 12 which includes a front circuit board enclosure 14a and a rear circuit board enclosure 14b, referred to in common as the enclosure 14. Each enclosure 14 includes a number of parallel slots 15 which accommodate one of two different types of modules. The first type of module is a circuit board module 16 which includes a circuit board having components mounted thereon. The other type of module is a baffle module 18, which cooperates with the circuit board modules 16 to direct the air flow only through the slots 15 having circuit board modules 16 installed within.

A given enclosure 14 thus has a plurality of circuit board modules 16 and baffle modules 18 arranged in parallel with each other; although the exact number and arrangement of each type of module depends upon the architecture of the system 10, there should either be a circuit board module 16 or a baffle module 18 installed in each slot 15 when the system 10 is operating.

Additional system components such as a power supply module 20, a disk drive 22, and control panel 24 are also positioned within the frame 12. A bulkhead area 28 may include additional peripheral devices such as additional disk drives and/or input output circuits.

An air-mover 30 is centrally positioned in the frame 12 to draw air into the frame 12 and through the enclosures 14 and bulkhead area 28. The air-mover 30 may typically be a fan or blower, as shown. A lower plenum 32 is positioned below the air-mover 30, and an upper plenum 34 is positioned above the air-mover 30. Plenums 32 and 34 assist in directing ambient air exactly where it is required within the frame 12.

Figure 2:
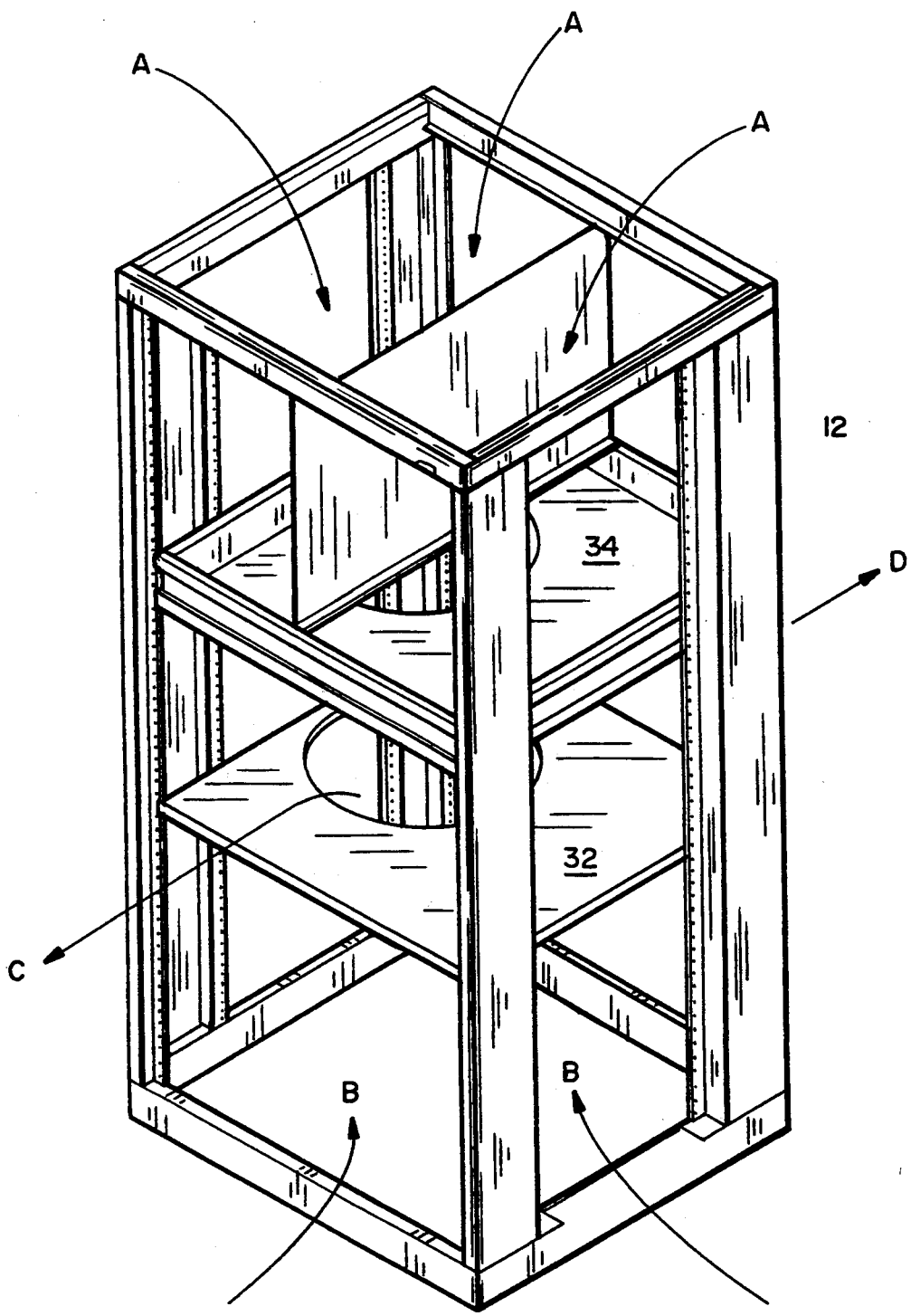
FIG. 2 is another view of the rack assembly with the enclosures, power supplies, air-mover, and bulkhead removed.

FIG. 2 is a view of the frame 12 with certain components removed to illustrate the air flow paths created by the air-mover 30 in greater detail. As indicated by the arrows A, air is drawn in through the top of the frame 12, past the space occupied by the enclosures 14a and 14b, and down through the center of the upper plenum 34. Similarly, as indicated by the arrows B, air is also drawn in through the bottom of the frame 12 past the bulkhead area 28 and through the hole in the lower plenum 32. As arrows C and D indicate, air is then exhausted through both the front and rear of the frame 12.

Figure 3:
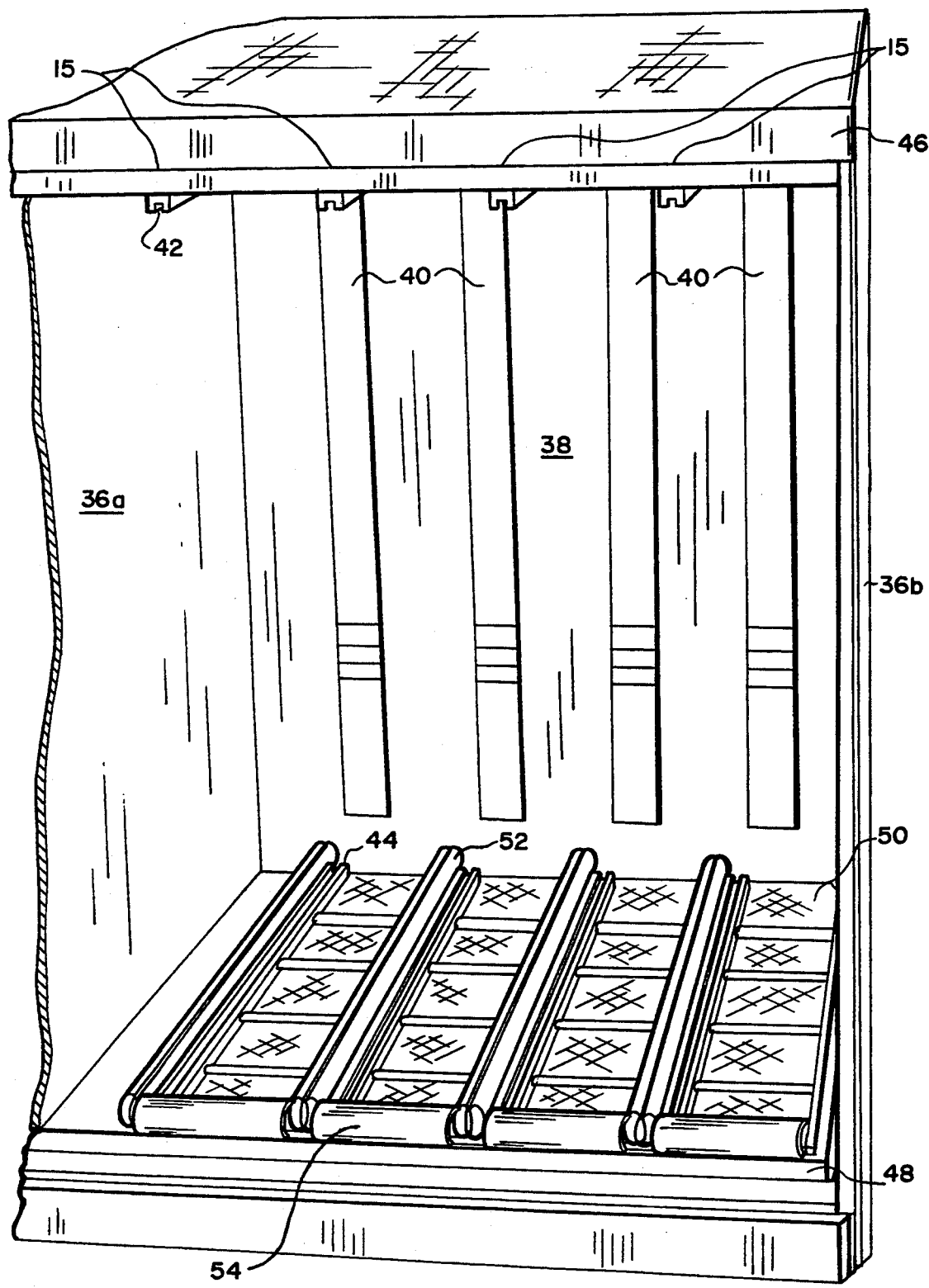
FIG. 3 is a perspective view of one of the enclosures.

FIG. 3 is a close-up, partially cut-away view of an enclosure 14 having the circuit board 16 and baffle 18 modules removed. Four of the slots 15a–15d are visible.

The enclosure 14 is a rectangular box structure having left and right sides 36a and 36b formed of sheet metal. A mother board 38 forms the rear of box and includes a circuit board connector 40 for each of the slots 15. The connectors 40a–40c are electrically interconnected on the motherboard 38 so that signals may pass between the circuit board modules 16 (FIG. 1). A top panel 46 and a lower panel 48 complete the box. Each slot 15 also includes upper 42 and lower 44 rails which engage the upper and lower periphery of the modules 16 and 18, thereby guiding them into place when they are inserted into the enclosure 14.

In accordance with the invention, screening 50 is integrally formed in top panel 46 and lower panel 48 so that air may pass through the top panel 46, through the circuit board modules inserted in the enclosure 14, and out through the lower panel 48.

An exemplary slot 15a in the enclosure 14 includes a connector 40a, an upper rail 42a, a lower rail 44a, a longitudinal seal 52a, and a front seal 54a. The longitudinal seals 52a–52d are U-shaped in cross-section, and are positioned in parallel with and adjacent to the left lower rail 44 in each slot 15. The forward seals 54a–54d are positioned perpendicular to the forward edge of the longitudinal seals 52a–52d, in the front of the enclosure 14.

Figure 4:
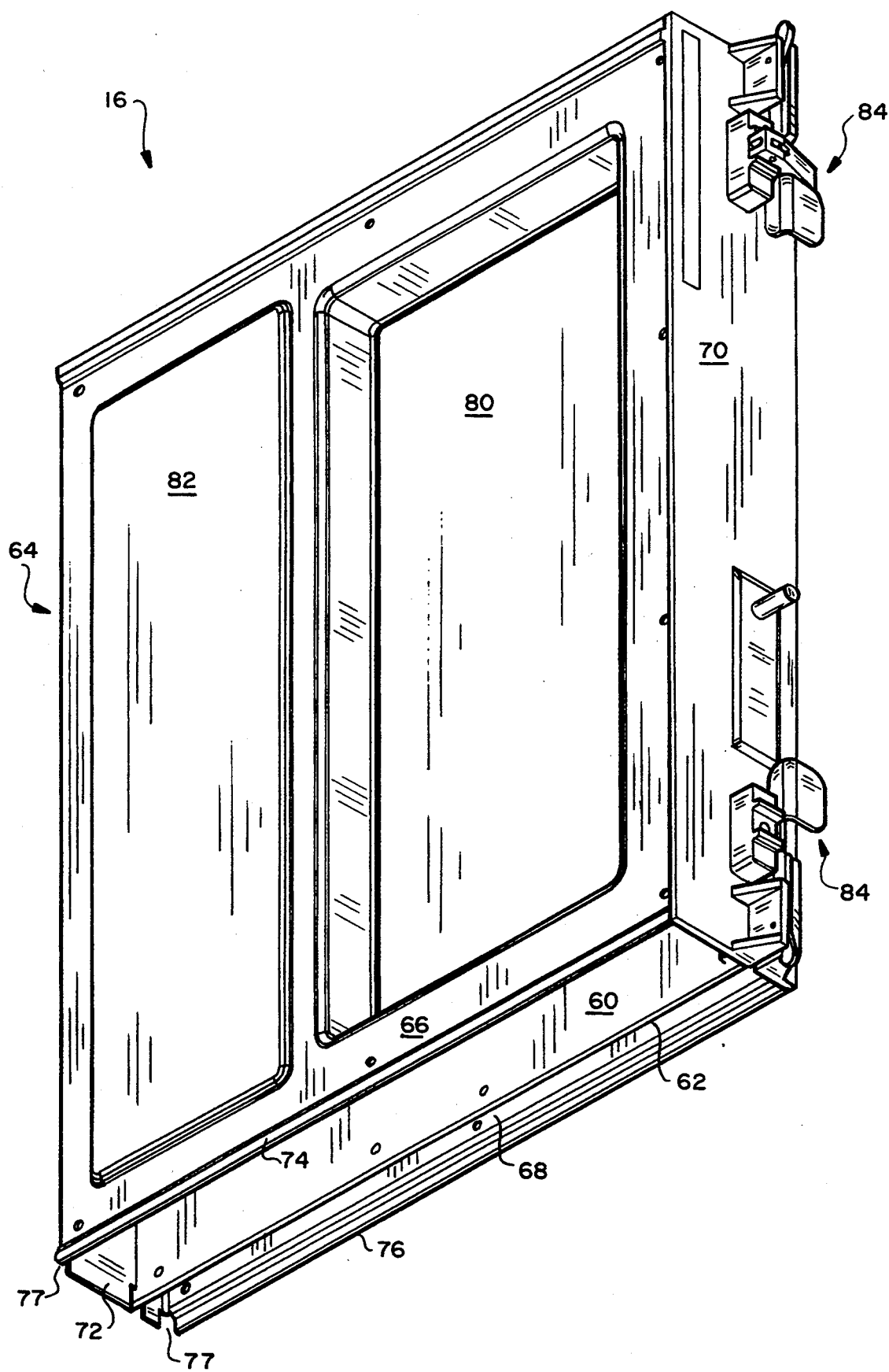
FIG. 4 is a perspective view of a printed circuit board module according to the invention.

FIG. 4 is a perspective view of an exemplary circuit board module 16, taken from below. The circuit board module 16 includes a printed circuit board 60 having a lower edge 62 and upper edge 63 (visible only in FIG. 6). The circuit board 60 is mounted in a housing 64 formed of a suitable material such as thermally-resistant plastic. The housing consists of left 66, right 68, front 70, and rear 72 sides.

The left side 66 of the housing 64 includes a flange 74 along its lower edge which flares outward and downward to form a notch 77 between the housing rear 72 and the housing left side 66.

The right side 68 of the housing 64 includes a similar flange 76 which flares outward and downward to form a notch 77 between the housing rear 72 and the right side 68. The flanges 74 and 76 engage the longitudinal seals 52 in the enclosure 14 to control the air flow through the enclosure 14, and in particular, to direct the air only into the interior of housing 64 along both sides of the circuit board 60, and not along the exterior of the housing sides 66 and 68.

A circuit board connector (not visible in the drawings) is typically mounted on the circuit board 60 adjacent the rear side 72 of the housing, to provide a path for electrical signals input to and output from the components on the circuit board 60.

Figure 6:
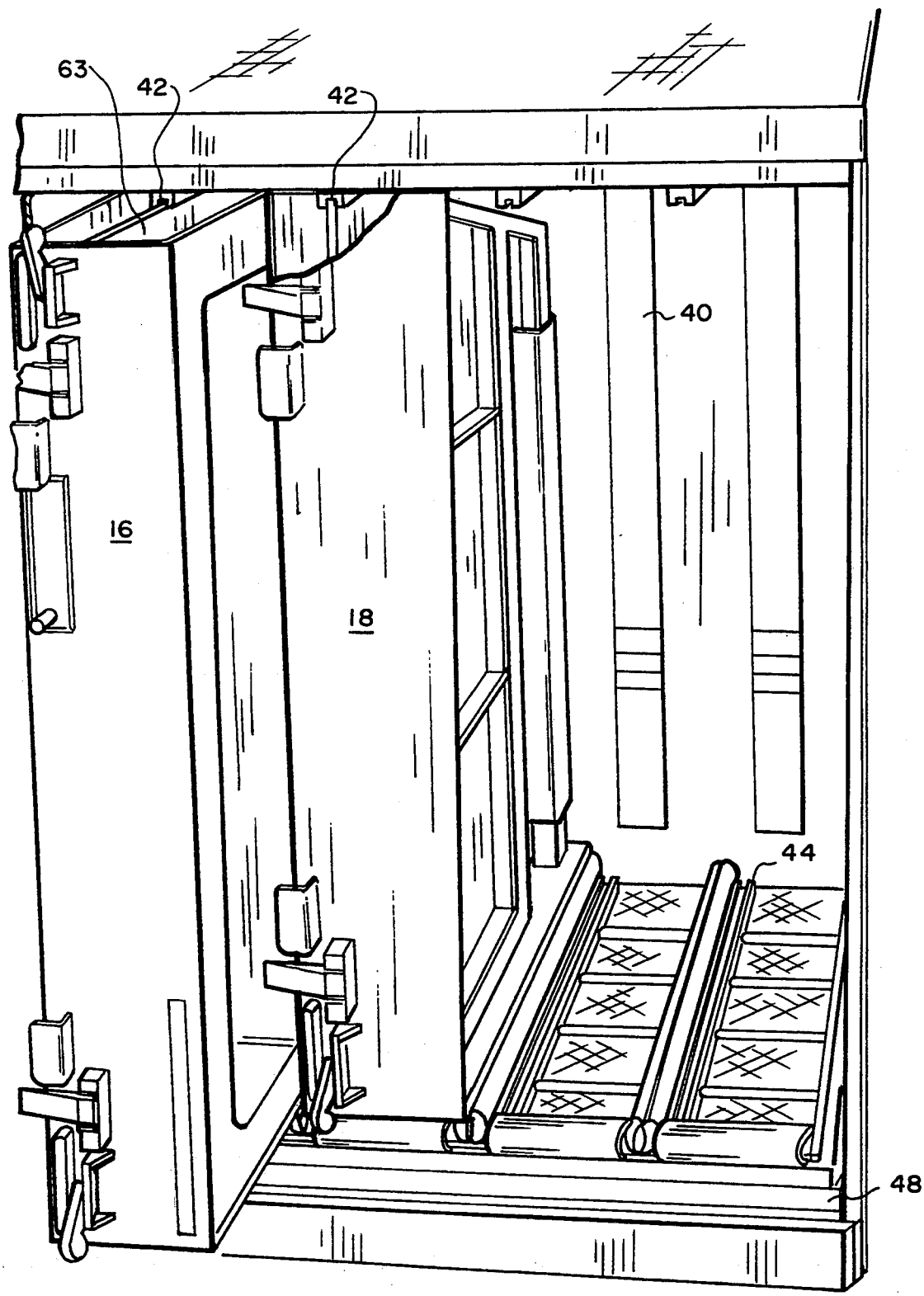
FIG. 6 is a partially cut-away view showing how the baffle modules and circuit board modules cooperate with seals to prevent air flow between adjacent modules.

The housing 64 is open at the bottom, as is shown in FIG. 4, as well as at the top, as shown in FIG. 6, so that air may flow past both sides of the circuit board 60.

Depressions such as those indicated at 80 and 82 may be formed integrally in the surface of the housing left side 66, adjacent the side of the circuit board 60 on which the electronic components are mounted. These depressions are shaped to further define the air flow channel between the left side 66 and the circuit board 60, and minimize the required air flow across the various components mounted on the circuit board 60. For example, the deeper depression 80 defines a narrow air flow path through the housing 64 for components which require a relatively small volume of air; the lesser depression 82 is formed adjacent the portions of the circuit board 60 which require a greater volume of air flow.

A latch mechanism 84 mounted on the housing front 70 locks the circuit board module 16 in place when it is positioned within the enclosure 14.

Figure 5:
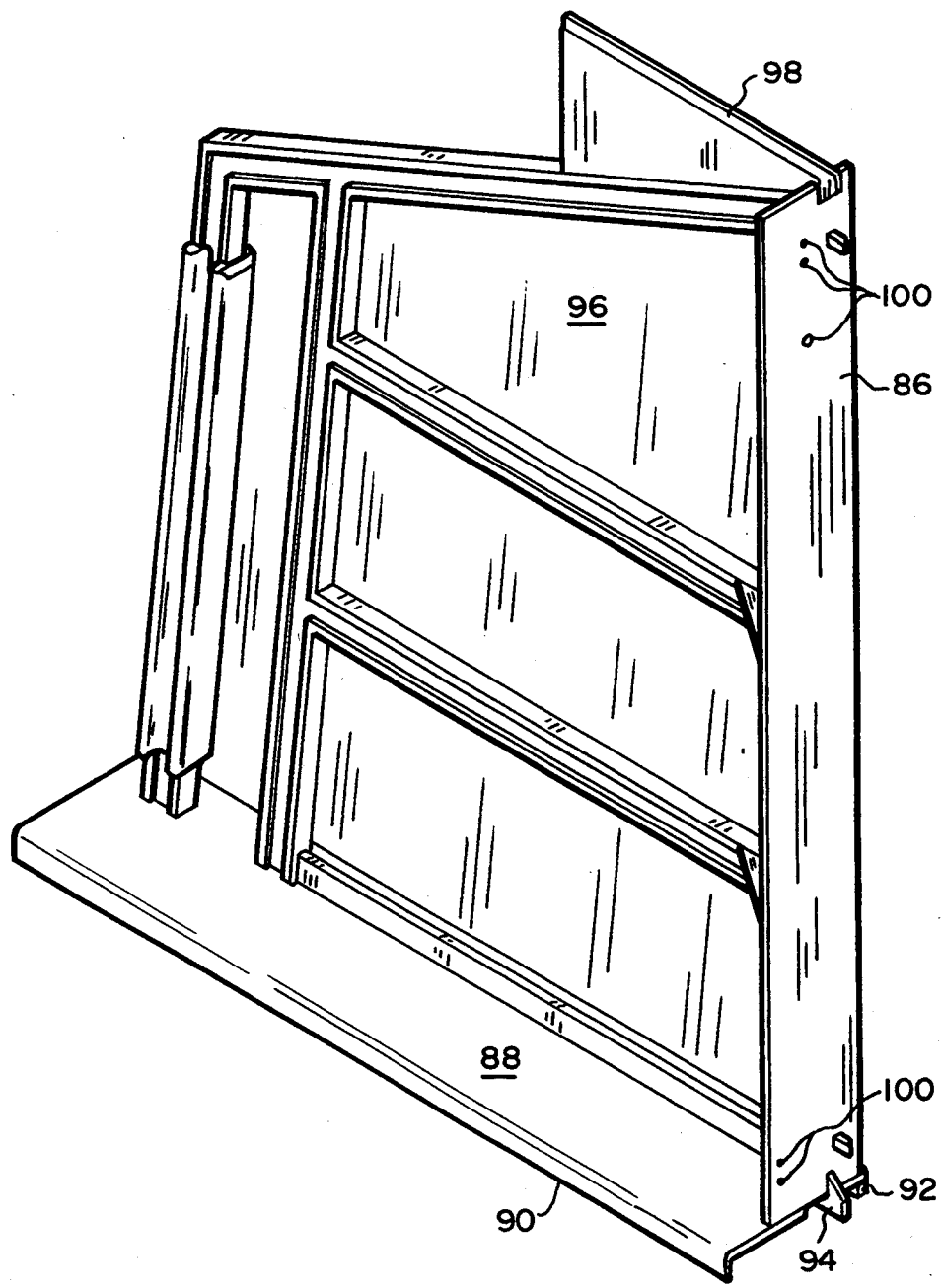
FIG. 5 is an perspective view of a baffle module according to the invention.

FIG. 5 is a perspective view of the baffle module 18, which is also formed of a suitable inexpensive material such as thermoplastic. The baffle module 18 includes a baffle front 86 which is attached to a central body 96, and a baffle bottom 88 attached to the lower portion of the body 96. The baffle bottom 88 has left and right flanges 90 and 92, and a parallel bottom tab 94 running along its length. A top tab 98 is also formed at the top of the body 96.

The bottom 94 and top 98 tabs serve the same function as the lower 62 and upper 63 edges of the circuit board module 16, that is, as the projecting surface which guides the baffle module 18 into its slot 15. Similarly, the left flange 90 and right flange 92 serve the same function as the left 74 and right 76 flanges in the circuit board module 16, that is, to engage the longitudinal seal 52 in the enclosure 14 to control the air flow through the enclosure 14.

The baffle bottom 88 presents a surface which is sized to essentially block all of the air flow through the slot 15 into which the baffle module 18 is inserted; the flanges 90 and 92 cooperate with the seals 52 to further prevent air flow around the sides of the baffle module 18.

Holes 100 in the baffle front 86 are used for fastening latches to the front face of the baffle module, in the same manner as the latches 84 in the circuit board modules 16. The latches on the baffle modules are shown in FIG. 6.

To better understand the functions of the circuit board 16 and baffle 18 modules in controlling the air flow paths through the enclosure 14, consider FIGS. 3 and 4 along with FIG. 6 in which a circuit board module 16 is partially inserted into the enclosure 14, and in which a baffle module 18 has already been fully inserted.

The circuit board module 16 is inserted into the slot 15a by aligning the upper circuit board edge 63 with the upper rail 42a; the lower edge 62 is aligned with the lower rail 44a. The circuit board module 16 is then slid along the upper 42a and lower 44a rails until the edge connector (not shown) on the rear 72 of the circuit board 60 engages the mother board connector 40a. The latches 84 are then operated to firmly seat the circuit board module 16 in the enclosure 14.

Inserting the circuit board module 16 into the slot 15 also inserts the left flange 74 into the seal 52a on the left side of the slot 15a. At the same time, the right flange 76 is inserted into the seal 52b to the right of the slot 15a.

As indicated by the arrows A in FIGS. 2 and 6, air presented from the top 46 of the enclosure 14 to the circuit board module 16 thus does not pass around the sides of the housing 64, but rather only through the openings on either side of the circuit board 60.

The baffle module 18 is similarly inserted into the enclosure 14, by aligning the bottom tab 94 thereof with the lower rail 44b in the slot 15b, the top tab 98 with the upper rail 42b, and by ensuring that the flanges 90 and 92 of the module are also inserted into the corresponding longitudinal seals 52.

Engaging the latch mechanism 84 on either module 16 or 18 causes the forward seal 54 to engage the inner surface of the housing front 70 or baffle front 86, thereby preventing airflow between the bottom of the modules and the lower panel 48.

Figure 7:
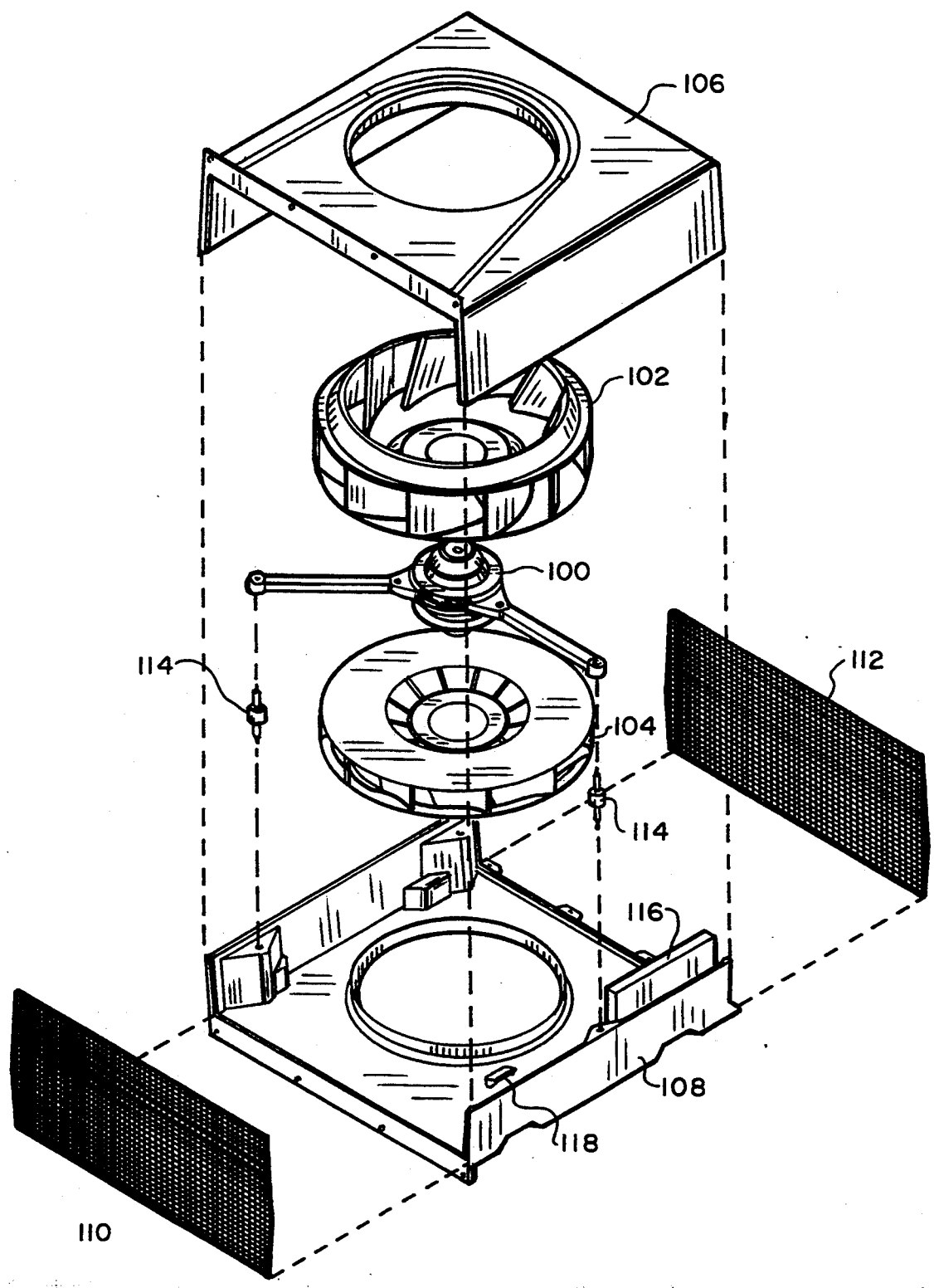
FIG. 7 is an exploded view of the air-mover showing the preferred position of a sensor which controls the air-mover speed.

FIG. 7 is an exploded view of the air-mover 30, which includes a motor 100, an upper impeller 102, a lower impeller 104, an upper air-mover housing 106, a lower air-mover housing 108, front 110 and rear 112 screens, and motor bushings 114. An air-mover speed control module 116 is inserted within the housing 108 and is electrically connected to an air flow sensor 118 also disposed within the lower air-mover housing 108.

Figure 8B:
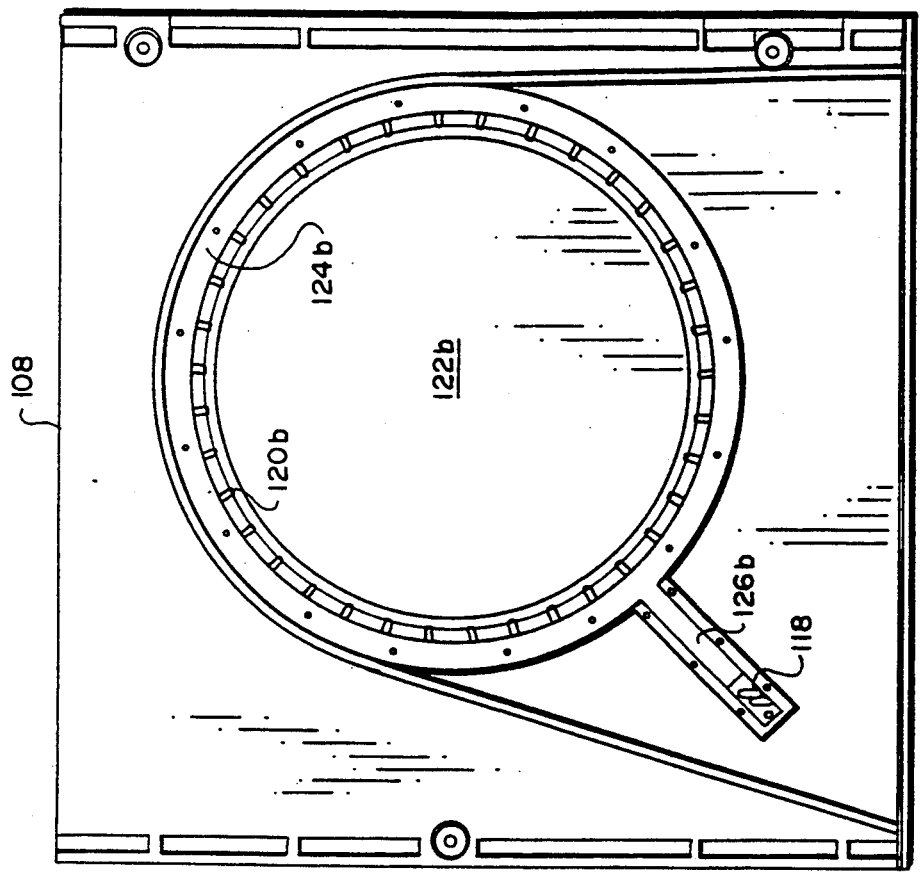
FIGS. 8A and 8B are plan views of the upper and lower air-mover housing showing the taps which feed air from the plenum into a circumferential common channel.
Figure 8A:
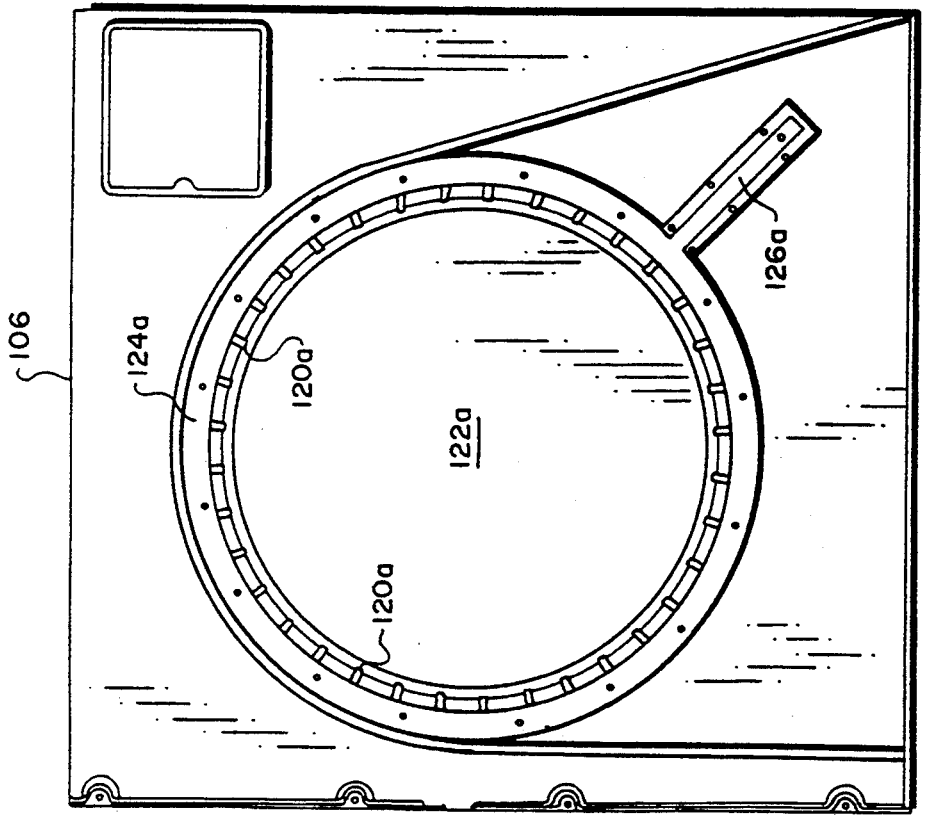

FIG. 8A is a plan view of the upper housing 106 showing a number of holes or taps 120a disposed about the periphery of a central plenum 122a. The taps 120a allow air from the plenum 122a to pass through to a circumferential channel 124a. The circumferential channel 124 in turn passes the air from the plenum to a sensor channel 126a.

FIG. 8B is a similar plan view of the lower housing 108 showing the similarly arranged taps 120b, plenum 122b, and circumferential channel 124b which correspond to the components of the upper housing 106.

Alternatively, the sensor 118 and air-mover control module 116 may be placed within one of the circuit board modules 16, such as a central processing unit, which is known to always be installed in the enclosure 14. What is important is that the sensor 118 be disposed in a position in the computer system 10 in which the air flow resistance does not change as the system configuration changes.

For maximum performance accuracy, the sensor 118 is a differential pressure sensor which measures the difference in air pressure between the plenum and ambient air outside the enclosure 14. However, other physical quantities vary in accordance with the air pressure at the plenum, such as air flow volume and temperature. Accordingly, the air-mover control module 116 may be a less expensive air volume sensor or temperature sensor in applications which for which lower cost is important.

Additionally, the sensor 118 may be compensated for changes in environmental conditions using previously known techniques such as those described in U.S. Pat. No. 4,669,025 to Barker et al. and assigned to Digital Equipment Corporation, which description is incorporated herein by reference.

During operation of the air-mover 30, then, an air flow path is provided by means of the taps 120a and 120b which sample the air pressure around the upper plenum 122a, as well as the lower plenum 122b, and in turn provide the air sample to the air sensor 118.

In response, the sensor 118 feeds a signal to the control module 116 which, in turn, is connected to control the speed of the motor 100, in particular, to increase or decrease the volume of air being supplied by the air-mover 30 in response to the air flow measurement. The sensor 118 and air-mover control module 116 thus cooperate with the air-mover 30 to maintain a constant static air pressure in the plenum regardless of the volume of air supplied by the air-mover 30, within the design parameters of the system.

For example, if a baffle module 18 is replaced by a circuit board module 16, an additional parallel air flow path is created in the enclosure 14. This causes a momentary relative drop in the static air pressure, as detected by the air sensor 118. However, this drop in air pressure in turn causes the control module 116 to increase the speed of the motor 100 until the desired air pressure is again achieved, thereby increasing the volume of air from the air-mover 30 to compensate for the opening created by the new circuit board module 16.

And, by inserting a baffle module 18 to close off an empty slot 15, the total air flow volume required to achieve the predetermined static pressure is reduced, which in turn means that the speed of the air-mover 30 will also be reduced.

In this manner, the air flow is automatically increased or decreased by the required amount by simply inserting or extracting modules 16 or 18, without further intervention, and the audible noise level produced by the air-mover 30 is also automatically changed.

To better understand this phenomenon, consider that the air flow path to the sensor 118 is in parallel with the other air flow paths through the slots 15 in the enclosure 14. Thus, if the air flow through the sensor path, which has a known air flow resistance, is maintained at the desired static pressure, then the desired air flow is also provided through each of the other parallel paths, regardless of whether a circuit board module 16 or baffle module is inserted in each slot. In other words, by maintaining a constant air pressure through one path having a known air flow resistance, the desired air flow volume is maintained through every other path.

An analogy to electric circuit theory can be used to explain the operation of the air flow control arrangement. Because the air flow paths are independent of each other, they can be modeled as electrical resistors arranged in parallel. The air flow path having a known air flow resistance can be then considered to be a reference resistor. The static air pressure in the system is modelled as a voltage applied to the parallel resistors; the air flow volume is thus simply the current through each resistor. By maintaining a fixed reference current (air flow volume) through the reference resistor (air flow path having a known air flow resistance), the same voltage (air pressure) is maintained across all of the other resistors, regardless of how many other resistors (air flow paths) are connected in parallel with the reference resistor at a given time.

Thus, by maintaining the desired air flow through any one slot 15, the proper air flow is maintained through every other slot 15, regardless of how many slots 15 have circuit board modules 16 (or baffle modules 18) inserted in them.

In one application of the invention to a computer system, a substantial difference in the required air flow has been observed. In this computer system, the entry level configuration includes a central processor module, two memory modules, and two I/O modules, for a total of five circuit board modules 16. A fully expanded system includes four processor modules, eight memory modules, and eight I/O modules 16, for a total of twenty circuit board modules 16. Using this invention, the reduction in required air flow between the entry level and fully expanded systems was estimated to be over seventy percent, and an overall noise reduction of about fourteen decibels was also observed.

The foregoing description has been limited to a specific embodiment of this invention. It will be apparent, however, that variations and modifications may be made to the invention, with the attainment of some or all of its advantages. Therefore, it is the object of the appended claims to cover all such variations and modifications as come within its true spirit and scope.

What is claimed is:

1. An apparatus for packaging and cooling electronic components, the components mounted on a plurality of circuit boards, the apparatus comprising:
   A. an enclosure, including a plurality of parallel enclosure slots, each of said enclosure slots including:
      (i) a top wall,
      (ii) a bottom wall
      (iii) longitudinal seals extending along the bottom wall, and
      (iv) an end seal extending along the bottom wall between the longitudinal seals and in a direction perpendicular to the longitudinal seals;
   the enclosure including at least one slot in which air flow resistance is known;
   B. circuit board modules for accepting circuit boards, each of the circuit board modules being shaped to fit into an enclosure slot and including
      (i) a first opening,
      (ii) a second opening, and
      (iii) flanges which mate with the longitudinal and end seals of the enclosure slot, the circuit board module and slot forming an isolated air flow path in which air flows through the first opening around a circuit board included therein and out the second opening;
   C. an airflow sensor, positioned to determine static air pressure in the enclosure slot having a known airflow resistance, the airflow sensor producing an air pressure signal indicative of the static air pressure in said enclosure slot; and
   D. an air-mover for moving air through the enclosure, the air-mover receiving the air pressure signal from the airflow sensor and controlling the speed with which air is moved through the enclosure so as to maintain a predetermined static air pressure in the enclosure slot with known airflow resistance, the air-mover thereby maintaining predetermined airflows through the other enclosure slots which contain circuit board modules.

2. An apparatus as in claim 1 wherein the airflow path having a known airflow resistance is an airflow path in parallel with a plurality of the air flow paths through the enclosure slots.

3. An apparatus as in claim 1 wherein the airflow path having a known airflow resistance is a circumferential channel disposed about a plenum of the air-mover, and the circumferential channel receives air from the plenum at a plurality of taps disposed about the plenum.

4. An apparatus as in claim 1 wherein baffle modules are inserted into the enclosure slots which do not contain circuit board modules, each of the baffle modules engaging the end seal and the longitudinal seals of the enclosure slot into which the baffle module is inserted, to prevent air from flowing through the slot.

5. An apparatus as in claim 4 wherein each of the baffle modules include peripheral flanges which cooperate with the longitudinal seals disposed in the enclosure slot into which the baffle module is inserted.

6. An apparatus as in claim 1 wherein the airflow sensor directly measures static air pressure in the enclosure slot having a known airflow resistance by measuring a difference in air pressure between the air in the slot and ambient air outside the enclosure.

7. An apparatus as in claim 1 wherein the airflow sensor measures airflow volume in the enclosure slot having a known airflow resistance and determines from the airflow volume the static air pressure in the slot.

8. An apparatus as in claim 1 wherein the airflow sensor senses air temperature in the enclosure slot having a known airflow resistance and determines from the air temperature the static air pressure in the slot.

9. An apparatus as in claim 1 wherein the circuit board modules include contoured sides that direct the airflow over components mounted on the circuit board.

10. An enclosure for connecting circuit boards into a back plane of a computer system, the enclosure having a plurality of parallel slots, each of which is aligned with a connector for receiving a circuit board, the enclosure including an air-mover that moves ambient air across the circuit boards in parallel, the enclosure further comprising:

circuit board modules, shaped to fit into the enclosure slots, each circuit board module accepting a circuit board and, when fit into an enclosure slot, aligning the circuit board with one of the connectors, the circuit board modules having first and second openings, respectively, on two opposing sides such that when the circuit boards and circuit board modules are positioned within the enclosure slots the air-mover causes ambient air to flow, at each circuit board module through the first of said openings, across the circuit board, and through the second of said openings, the circuit board modules isolating the air flow paths across the circuit boards;

baffle modules, shaped to fit into the enclosure slots, each of the baffle modules including at least one side disposed to block ambient air flow from the air-mover through the slot into which the baffle module is inserted;

an airflow sensor, for determining static air pressure at a position within the enclosure which has a predetermined air flow resistance; and an air-mover controller for controlling the speed of the air-mover and thus the volume of ambient air presented to the circuit boards, the controller controlling the speed of the air-mover based on the static air pressure determined by the air sensor so as to maintain a predetermined static air pressure at said position within the enclosure and thereby maintain predetermined air flows at the first openings of the circuit board modules.

11. An enclosure as in claim 10 wherein the airflow sensor measures directly the static air pressure at the position within the enclosure which has a predetermined airflow resistance by measuring a difference in air pressure between the air at the position and ambient air outside the enclosure.

12. An enclosure as in claim 10 wherein the airflow sensor measures air flow volume.

13. An enclosure as in claim 10 wherein the airflow sensor senses air temperature.

14. An enclosure as in claim 11 wherein the sensor is disposed adjacent a plenum of the air-mover.

15. An enclosure as in claim 11 wherein the sensor is disposed adjacent an air-mover plenum, and the sensor receives air from a plurality of taps disposed about the air-mover plenum.

16. An enclosure as in claim 11 wherein the circuit board modules housing additionally includes contoured sides that further specifically direct the airflow over components mounted on the circuit board.

17. An apparatus comprising:

an enclosure including a plurality of parallel circuit board slots for receiving circuit boards, each slot shaped to accept a circuit board and including means for maintaining an isolated air flow path for the circuit board inserted therein;

an air-mover, positioned to cause air to flow through the slots;

an air sensor for determining static air pressure in a slot which has a known air flow resistance; and control means, connected to the air sensor, for controlling the speed of the air-mover based on the determination of static air pressure by the air sensor to maintain a predetermined air flow rate in the slot with the known air flow resistance and thereby maintain predetermined air flow rates in the other circuit board slots.

* * * * *